(12) United States Patent
Sakaki (10) Patent No.: US 6,978,534 B2
(45) Date of Patent: Dec. 27, 2005

(54) DEVICE FOR PRESSURE BONDING AN INTEGRATED CIRCUIT TO A PRINTED CIRCUIT BOARD

(75) Inventor: Takashi Sakaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 318 days.

(21) Appl. No.: 10/345,484

(22) Filed: Jan. 17, 2003

(65) Prior Publication Data

US 2003/0140484 A1 Jul. 31, 2003

(30) Foreign Application Priority Data

Jan. 25, 2002 (JP) ........................................ 2002-016924

(51) Int. Cl.[7] .............................................. B23P 19/00
(52) U.S. Cl. ............................. 29/740; 29/741; 29/840; 257/778
(58) Field of Search ........................ 29/740, 741, 840; 257/778, 798, 688; 438/108; 156/332

(56) References Cited

U.S. PATENT DOCUMENTS 5,115,545 A * 5/1992 Fujimoto et al. .......... 29/25.01
6,269,999 B1 * 8/2001 Okazaki et al. .......... 228/110.1
6,559,523 B2 * 5/2003 Schmid et al. .............. 257/673

FOREIGN PATENT DOCUMENTS

JP 2000-68633 3/2000

* cited by examiner

*Primary Examiner*—Nathan J. Flynn
*Assistant Examiner*—Leonardo Andújar
(74) *Attorney, Agent, or Firm*—Fitzpatrick, Cella, Harper & Scinto

(57) ABSTRACT

A pressure device for pressure bonding an IC chip on a circuit board includes an IC pressurizing member having a groove extending in a predetermined direction, and formed on a surface opposite to a surface abutting the IC chip. A columnar member is provided overlapped on the IC pressurizing member so as to bring an external surface thereof into contact within the groove of the IC pressurizing member. A pressure receiving member has a groove extending in a predetermined direction and overlapped on the IC pressurizing member so as to bring an external surface of the columnar member into contact within the groove thereof. An adjusting member adjusts parallelism between the IC pressurizing member and the pressure receiving member, and a fixing member fixes a relative position between the IC pressurizing member and the pressure receiving member.

3 Claims, 10 Drawing Sheets

DEVICE FOR PRESSURE BONDING AN INTEGRATED CIRCUIT TO A PRINTED CIRCUIT BOARD

BACKGROUND OF THE INVENTION

1. Field of the Invention

The present invention relates to a pressure device for pressure bonding an integrated circuit (IC) on a printed circuit board.

2. Description of the Related Art

Recently, in electrical circuit devices having IC chips mounted on circuit boards, advances have been achieved resulting in the increase in electrical signal velocity and integration density, and in the reduction in size. As a result, signal wiring is becoming fine in pitch and the number of pins is increasing. Along therewith, it has become more difficult to obtain positional accuracy and connection reliability in the process of bonding IC chips on a circuit board.

As a method for mounting an IC chip on a circuit board such as a ceramic substrate for a micropattern, silicon substrate, and glass substrate for liquid crystal, at present, wire bonding, a solder bump, stud bump, anisotropic conductive film (ACF), anisotropic conductive paste (ACP), nonconductive film (NCF), and nonconductive paste (NCP) are combined. Also, in such a mounting method, a chip on board (COB) device is used. For example, as such a COB device, a device adaptable to work with a wide space between ICs is known, in which an IC chip is bonded with a melted solder bump. Since the solder bump has a self-alignment mechanism itself, an allowable range in parallelism between the substrate and IC chips is large in such a COB device.

In the typical COB device, IC chips and the circuit board are sandwiched to perform heating and pressure bonding with a pair of tools arranged at the top and bottom. One such COB device is a one-position fixed type having one heating and bonding position with the tool. Another type of COB device is a plural-positions moving type, in which one of the tools arranged at the top and bottom (the top tool, for example) is fixed and the other (substrate-mounted stage) is moved. An example of the latter type COB device using the ACF is disclosed in Japanese Patent Laid-Open No. 2000-68633. In this disclosure, an elastic sheet is interposed therebetween, in order to reduce nonuniformity in pressure due to differences in height.

However, the following problems have been encountered in the conventional mounting method. Like reference characters will be used to designate like members in FIGS. 1 to 8.

Figure 1:
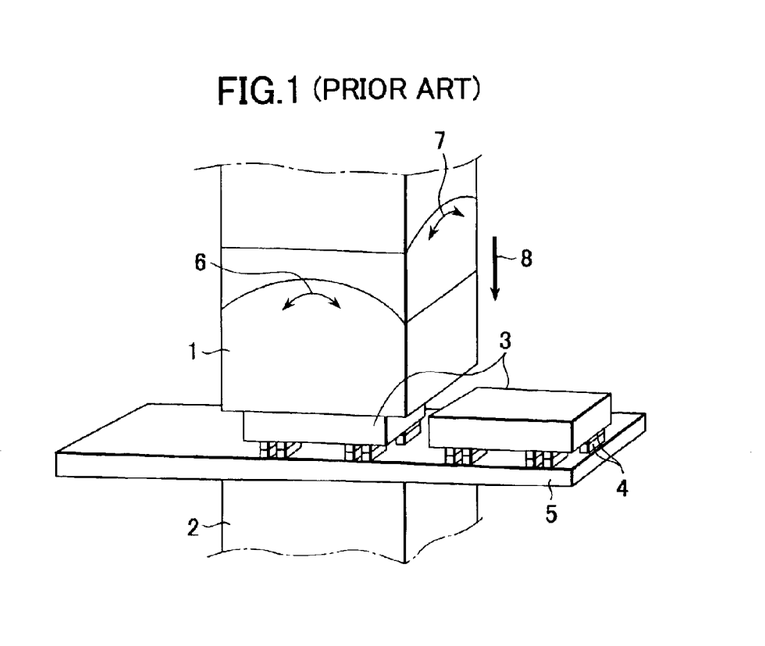
FIG. 1 is a schematic perspective view of an example of a conventional pressure device.
Figure 2:
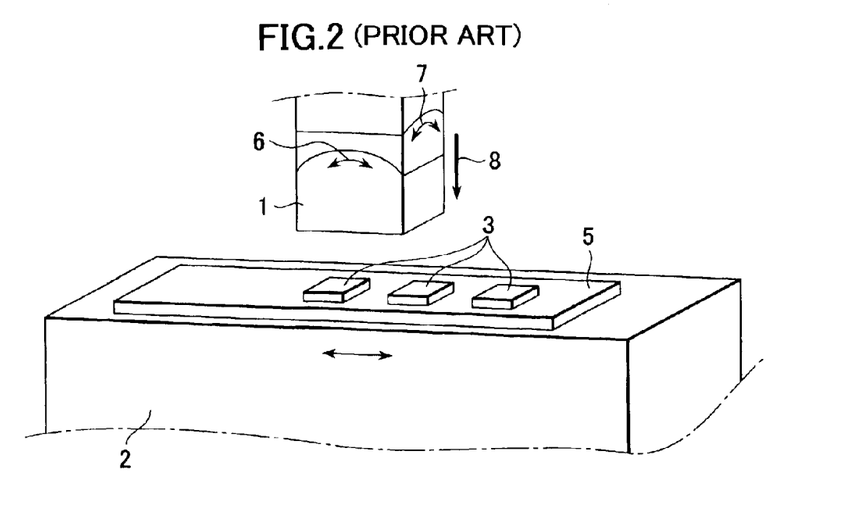
FIG. 2 is a schematic perspective view of another example of a conventional pressure device.
Figure 3:
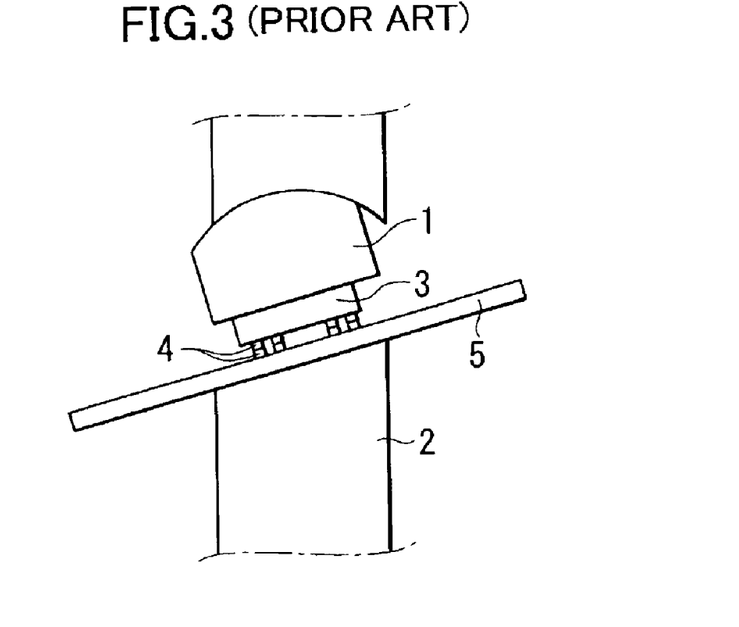
FIGS. 3 and 4 are schematic sectional views showing pressurizing an IC chip using a conventional pressure device.

A COB device may be at the one-position fixed type, as shown in FIG. 1, and the plural-positions moving type, shown in FIG. 2, in which a stage with a circuit board 5 is moved. In either type, in order to uniformly pressurize bumps 4 (not visible in FIG. 2) and an IC chip 3 in the direction of arrow 8, an upper tool 1 and a lower tool 2 are provided. A mechanism for adjusting parallelism between the tools 1 and 2 is provided in at least one of the tools (the upper tool in FIGS. 1 and 2). Referring to FIGS. 1 and 2, the upper tool 1 is slidable in directions of arrows 6 and 7. FIG. 3 shows a one-position fixed type in a state that the IC chip 3 is press-bonded after the parallelism of the upper tool 1 is adjusted relative to inclination of the press-bonding surface of the lower tool 2.

Figure 4:
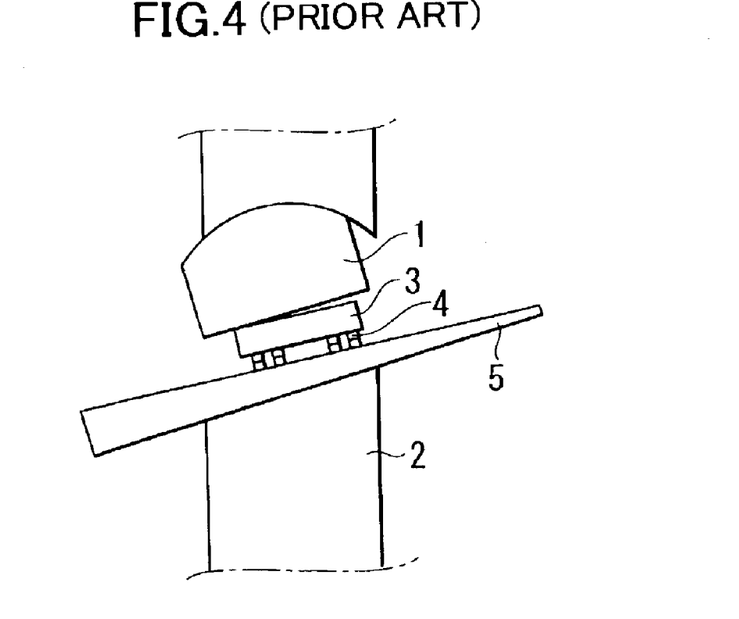

However, the parallelism adjusting mechanism mentioned above is for adjusting the parallelism between the press-bonding surfaces of the tools and not for adjusting the parallelism relative to each IC chip and circuit board. Therefore, as shown in FIG. 4, there is a first problem that for fluctuations in thickness of individual circuit boards 5 and IC chips 3 and fluctuations in height of individual bumps 4, uneven abutment and nonuniformity in a pressurization force are produced, and along therewith, nonuniformity in a connection resistance and instability in the connection reliability may be produced.

In the plural-positions moving type of the lower tool 2 (substrate-mounted stage), the upper tool 1 is provided with the parallelism adjusting mechanism, the upper tool 1 being parallel-adjusted at a predetermined position corresponding to every press-bonding position of the lower tool 2. Also, in this type, in addition to the same problem as in the one-position fixed type, errors are produced in a parallel-adjusted position due to fluctuations in positional accuracy of the reciprocating stage.

A second problem is that if the IC chips to be connected are arranged at a small pitch, it may occur that a number of the IC chips cannot be connected, because of the size and shape of the upper tool 1 for heating and pressurizing the IC chips.

Figure 5:
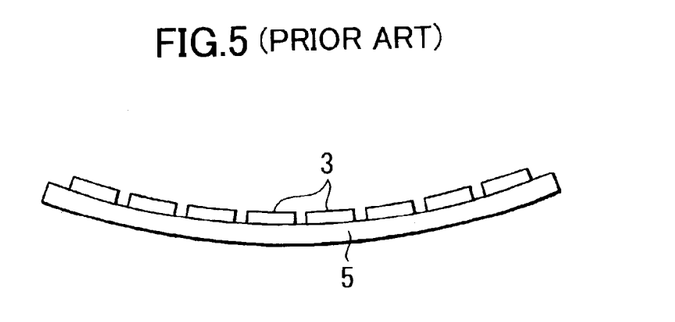
FIGS. 5 to 8 are schematic sectional views showing a circuit board having the IC chips mounted thereon by a conventional pressure device.

A third problem is that when a plurality of the IC chips 3 are mounted on one circuit board 5 in the COB device as shown in FIG. 5, the circuit board 5 is warped in the longitudinal direction. This is significant in a silicon substrate with a thickness of 625 μm, length of 100 mm, and width of 7 mm having 8 to 9 thin bare IC chips with a thickness of 175 μm, length of 10 mm, and width of 2.5 mm mounted thereon, where it is confirmed that the substrate is warped by 40 to 50 μm.

Figure 6:
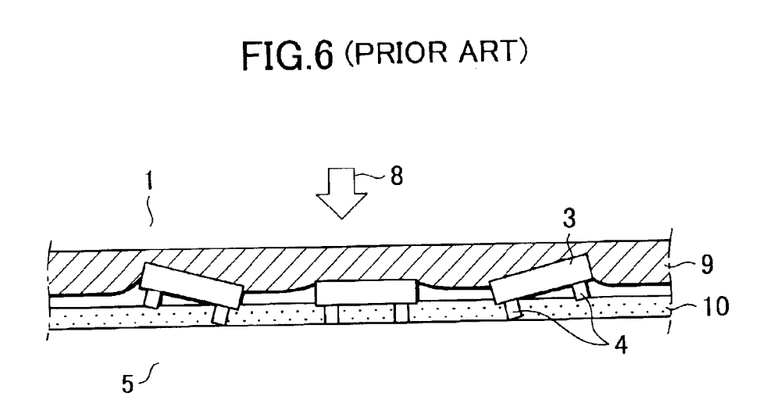

A fourth problem is that in a method for pressing the IC 3 with an elastic sheet interposed therebetween, disclosed in Japanese Patent Laid-Open No. 2000-68633, as shown in FIG. 6, when the back face of the IC chip 3 is inclined relative to the pressing direction, nonuniform distribution in the pressure is produced, resulting in nonuniformity of crush amounts of the bumps 4 and of a connection state.

Figure 7:
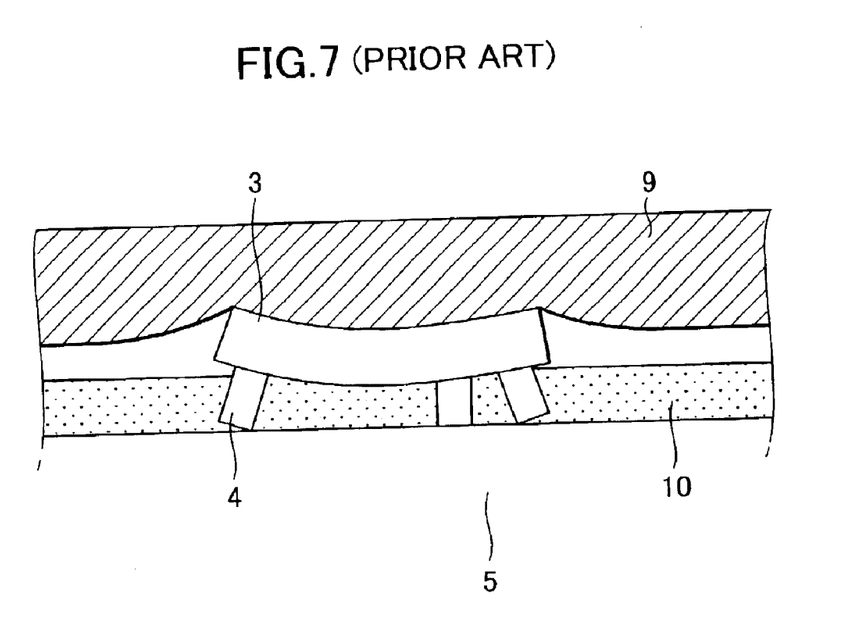
Figure 8:
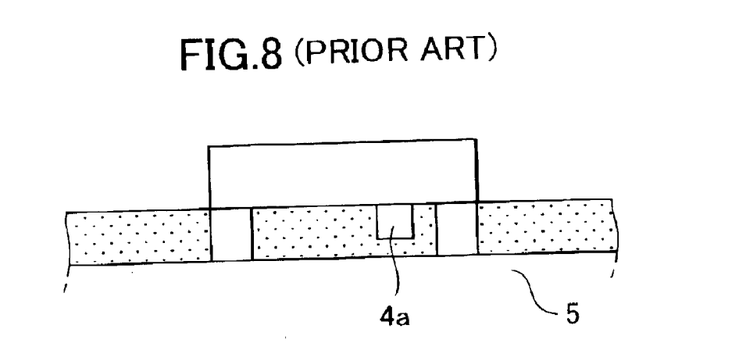

Furthermore, as shown in FIG. 7, there is also a problem that because the elastic sheet 9 pressurizes the back surface of the IC chip 3 with a uniformly distributed force, portions, particularly where the bumps 4 do not exist in the bump arrangement, cave in, resulting in a warp of the IC chip 3. The warp of the IC chip 3 is significant especially in the case of a thin IC. When the warped IC is bonded and mounted, an ACF resin changes in quality and is softened while the warped IC chip is to get back, after a heating process performed thereafter or a reliability test. Then, as shown in FIG. 8, a largely crushed bump 4a is separated from the substrate 5, resulting in defective bonding.

Moreover, in the mounting method using the elastic sheet, it is difficult for the elastic sheet to follow the height differences and different force may be applied of the IC chips for adjacent chips. If there are differences in height, the elastic sheet follows the higher IC chips, so that the lower IC chips are not abutted by the elastic sheet and not subjected to a force.

SUMMARY OF THE INVENTION

It is an object of the present invention to provide a pressure device capable of mounting IC chips on a circuit board with high reliability by solving the problems of conventional techniques described above.

In order to achieve the object mentioned above, in accordance with a first aspect of the present invention, a pressure device for pressure bonding an IC chip on a circuit board comprises an IC pressurizing member having a groove extending in a predetermined direction, which is formed on a surface opposite to the surface abutting the IC chip; a columnar member overlapped on the IC pressurizing member so as to bring an external surface thereof into contact within the groove of the IC pressurizing member; a pressure receiving member having a groove extending in a predetermined direction and overlapped on the IC pressurizing member so as to bring an external surface of the columnar member into contact within the groove thereof; an adjusting member for adjusting parallelism between the IC pressurizing member and the pressure receiving member; and a fixing member for fixing a relative position between the IC pressurizing member and the pressure receiving member.

In accordance with a second aspect of the present invention, a pressure device for pressure bonding an IC chip on a circuit board comprises an IC pressurizing member having a groove extending in a first direction, which is formed on a surface opposite to the surface abutting the IC chip; a first columnar member overlapped on the IC pressurizing member so as to bring an external surface thereof into contact within the groove of the IC pressurizing member; an intermediate member having first and second surfaces opposing each other, the first surface having a first groove formed thereon and extending in the first direction, the second surface having a second groove formed thereon and extending in a second direction perpendicular to the first direction, the intermediate member being overlapped on the first columnar member so as to bring an external surface of the first columnar member into contact within the first groove thereof; a first adjusting member for adjusting parallelism between the IC pressurizing member and the intermediate member; a first fixing member for fixing a relative position between the IC pressurizing member and the intermediate member; a second columnar member overlapped on the intermediate member so as to bring an external surface thereof into contact within the second groove of the intermediate member; a pressure receiving member having a groove extending in the second direction and overlapped on the second columnar member so as to bring an external surface of the second columnar member into contact within the groove thereof; a second adjusting member for adjusting parallelism between the intermediate member and the pressure receiving member; and a second fixing member for fixing a relative position between the intermediate member and the pressure receiving member.

In accordance with a third aspect of the present invention, a pressure device for pressure bonding an IC chip on a circuit board and having a plurality of pressure mechanisms arranged close to each other, each of the pressure mechanisms comprises an IC pressurizing member having a groove extending in a first direction, which is formed on a surface opposite to the surface abutting the IC chip; a first columnar member overlapped on the IC pressurizing member so as to bring an external surface thereof into contact within the groove of the IC pressurizing member; an intermediate member having first and second surfaces opposing each other, the first surface having a first groove formed thereon and extending in the first direction, the second surface having a second groove formed thereon and extending in a second direction perpendicular to the first direction, the intermediate member being overlapped on the first columnar member so as to bring an external surface of the first columnar member into contact within the first groove thereof; a first adjusting member for adjusting parallelism between the IC pressurizing member and the intermediate member; a first fixing member for fixing a relative position between the IC pressurizing member and the intermediate member; a second columnar member overlapped on the intermediate member so as to bring an external surface thereof into contact within the second groove of the intermediate member; a pressure receiving member having a groove extending in the second direction and overlapped on the second columnar member so as to bring an external surface of the second columnar member into contact within the groove thereof; a second adjusting member for adjusting parallelism between the intermediate member and the pressure receiving member; and a second fixing member for fixing a relative position between the intermediate member and the pressure receiving member.

Further objects, features and advantages of the present invention will become apparent from the following description of the preferred embodiments with reference to the attached drawings.

DESCRIPTION OF THE PREFERRED EMBODIMENTS

Embodiments according to the present invention will be described in detail below with reference to the drawings.

First Embodiment

Figure 9:
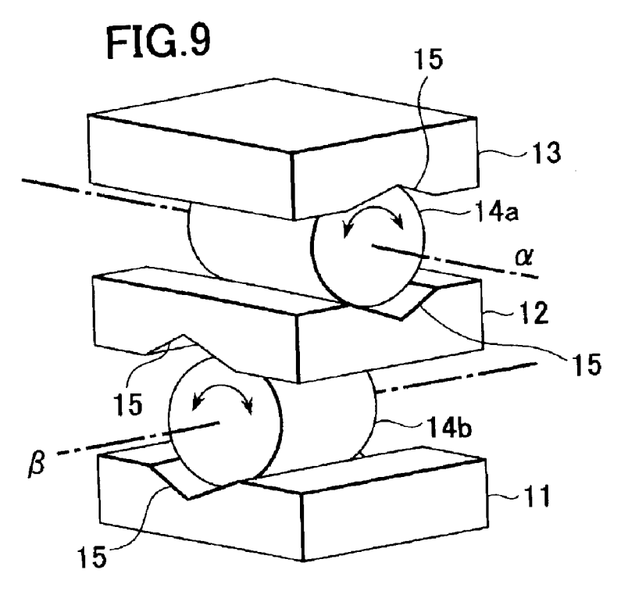
FIG. 9 is a schematic perspective view of a pressure device according to a first embodiment of the present invention showing only principal members of a parallelism adjusting mechanism.

FIG. 9 is a schematic perspective view of a pressure device according to the present invention in which only principal members of a parallelism adjusting mechanism for pressurizing IC chips and a circuit board in parallel with each other are shown. Referring to FIG. 9, an IC pressing member 11, an intermediate member 12, and a pressure receiving member 13 are provided with V-shaped grooves (concave portions) 15 for receiving columnar members 14a and 14b, respectively. Both ends of the V-shaped groove 15 may close up so as not to displace the columnar member. By fitting the columnar members 14a and 14b into the V-shaped grooves 15, the rotational direction is restricted to one direction. In such a manner, combinations between the V-shaped groove and the columnar member are arranged to be out of alignment with each other by 90°, so that the columnar members can independently rotate about axes $\alpha$ and $\beta$, respectively. This structure is a basic pattern for adjusting the parallelism between the IC chip and circuit board about the axes $\alpha$ and $\beta$.

Figure 10:
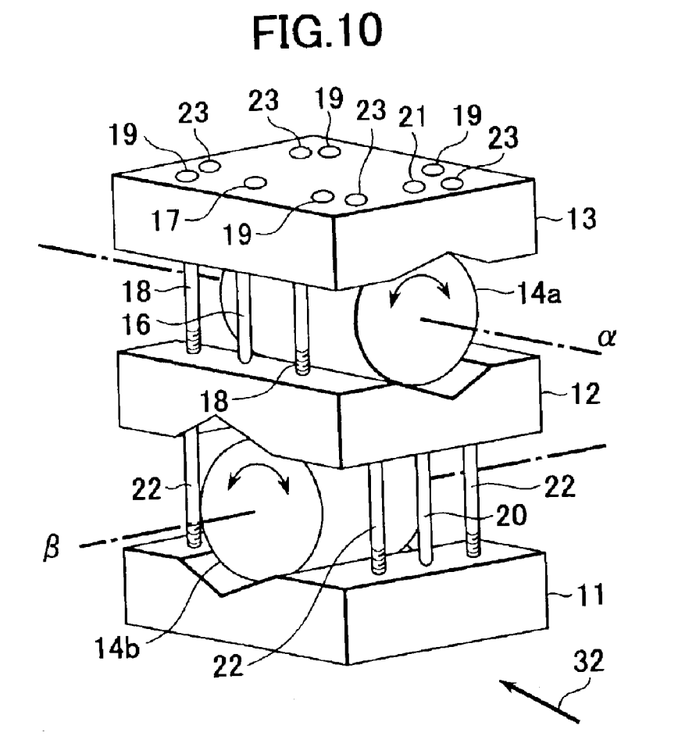
FIG. 10 is a schematic perspective view of a parallelism adjusting mechanism having adjusting pins and fixing screws in addition to the structure shown in FIG. 9.
Figure 11:
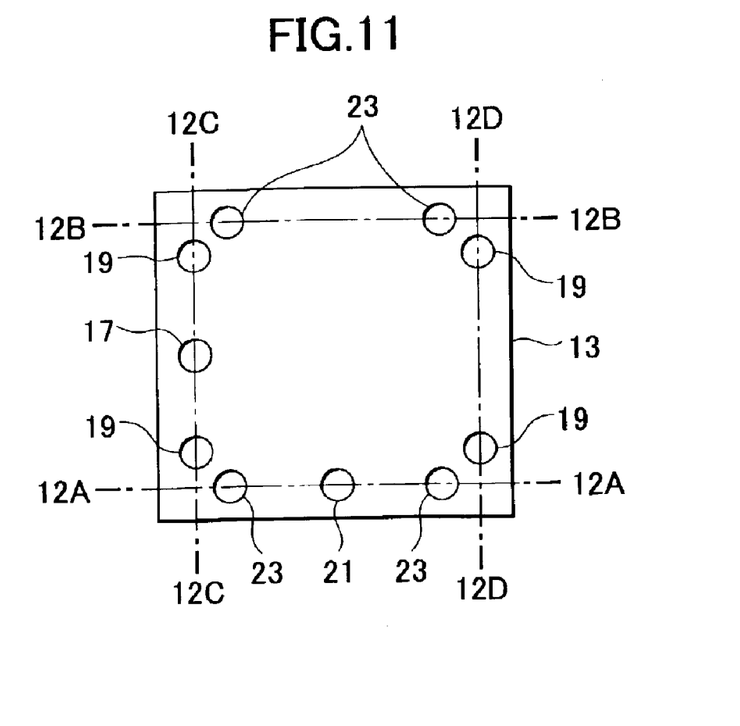
FIG. 11 is a plan view of the device shown in FIG. 10, in which the side indicated by arrow 32 is expressed on the bottom side.

FIG. 10 is a schematic perspective view of a parallelism adjusting mechanism in that adjusting pins and fixing screws are added to the structure shown in FIG. 9. FIG. 11 is a plan view of the parallelism adjusting mechanism in that the side indicated by the arrow 32 in FIG. 10 is expressed on the bottom side. FIGS. 12A to 12D are sectional views at the lines 12A—12A, 12B—12B, 12C—12C, and 12D—12D of FIG. 11, respectively. In FIGS. 10 and 11, and FIGS. 12A to 12D, like reference characters designate like members and like reference characters designate like members in FIG. 9, and the detailed description thereof is omitted.

Figure 12A:
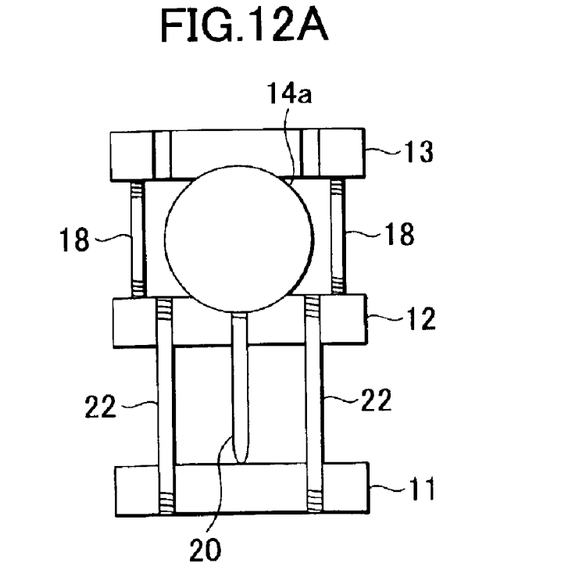
FIGS. 12A to 12D are sectional views of the device shown in FIG. 10 at the respective different lines.
Figure 12B:
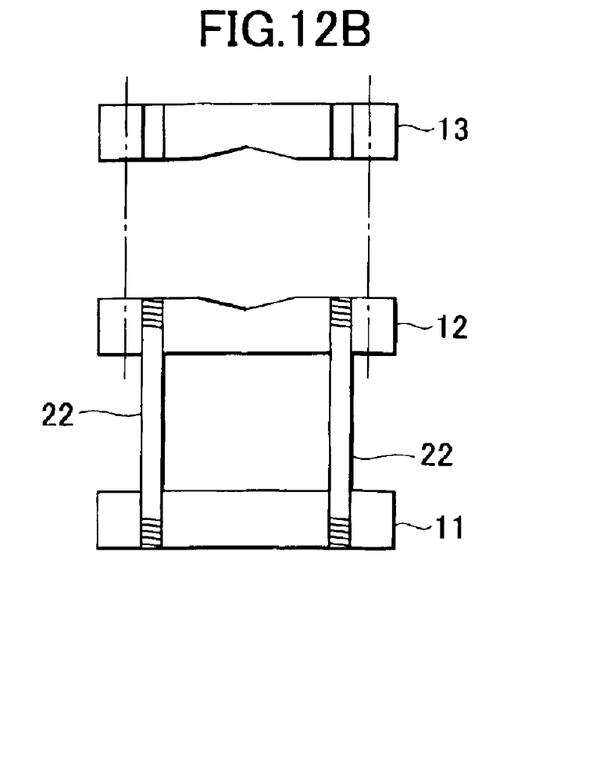
Figure 12C:
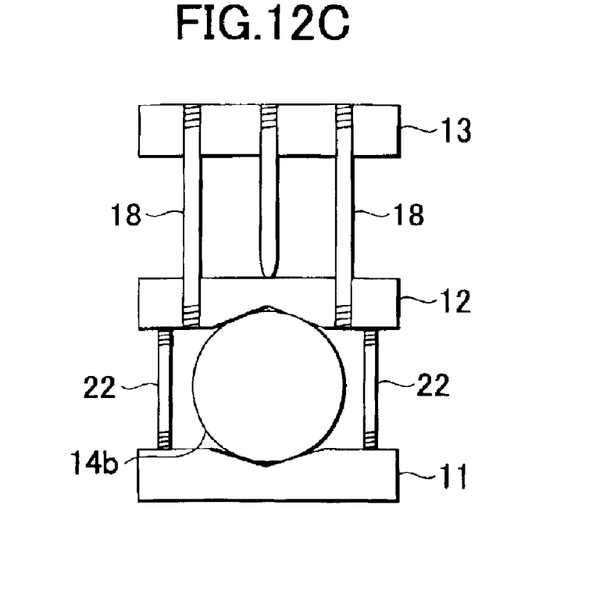
Figure 12D:
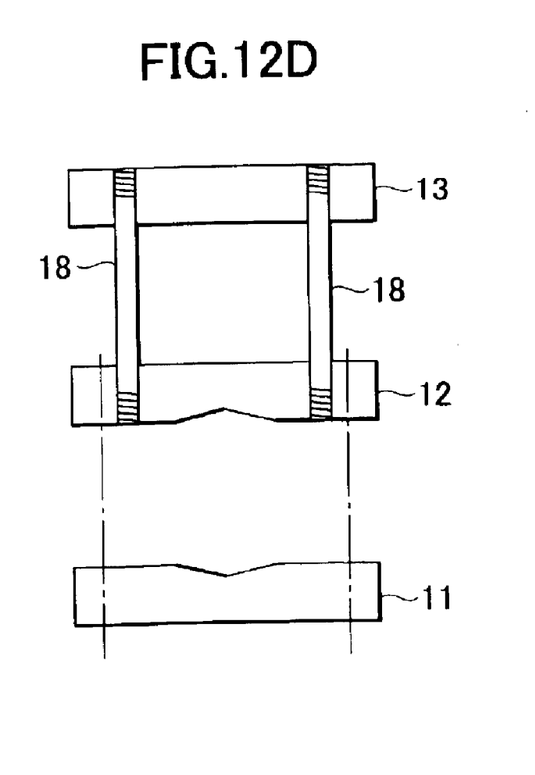

Referring to FIG. 10, the axis $\alpha$ denotes the imaginary rotational shaft about which the upper columnar member 14a rotates, and the axis $\beta$ denotes the imaginary rotational shaft about which the lower columnar member 14b rotates. Therefore, FIGS. 12A and 12B show a structure for rotating and fixing the axis $\beta$, i.e., the lower columnar member 14b. Also, FIGS. 12C and 12D show a structure for rotating and fixing the axis $\alpha$, i.e., the upper columnar member 14a.

The parallelism adjusting method will be described about the axis $\alpha$ at first. The parallelism between the pressure receiving member 13 and the intermediate member 12 is adjusted with a pushing pin 16 for adjusting the axis $\alpha$. The pushing pin 16 for adjusting the axis $\alpha$ uses M1 fine pitch cast thread, and the adjustment is performed through an adjusting screw hole 17. The position is fixed with screws 18 for fixing the axis $\alpha$ through fixing screw holes 19. The screw 18 for fixing the axis $\alpha$ also uses M1 fine pitch cast thread.

Next, the parallelism adjustment is also performed on the axis $\beta$ in the same way. The adjustment and fixing are performed using a pushing pin 20 for adjusting the axis $\beta$ and screws 22 for fixing the axis $\beta$ through an adjusting screw hole 21 and fixing screw holes 23, respectively.

Figure 13:
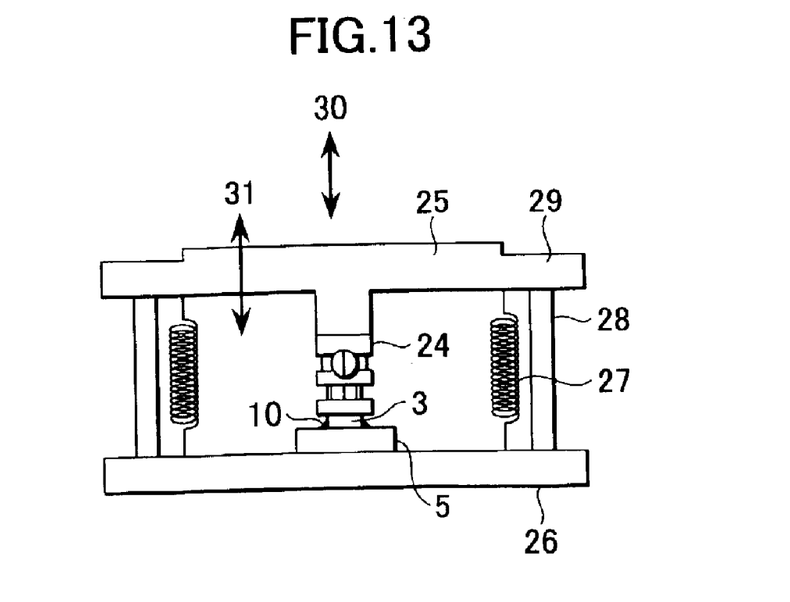
FIG. 13 is a schematic view of a pressure device having the parallelism adjusting mechanism shown in FIG. 10 and assembled therein.

FIG. 13 is a schematic view of a pressure device having a parallelism adjusting mechanism 24 assembled therein and shown in FIG. 10. The circuit board 5 on a base 26 is provided with an ACF bonded thereon, and the IC chip 3 positioned and mounted thereon is pressurized.

Referring to FIG. 13, a pressure rectangle 25 having the parallelism adjusting mechanism 24 assembled at an end thereof is fitted to vertical guides 28 with oilless bearings 29 interposed therebetween. The pressure rectangle 25 floats in midair by support springs 27 before the pressure is applied. Upon receiving a press-eliminating pressure 30 from the above, the pressure rectangle 25 moves vertically in a rectangle-moving direction 31. There are through-holes for operating adjusting and fixing screws of the parallelism adjusting mechanism 24 formed on the top surface of the pressure rectangle 25 corresponding to the respective holes. The parallelism adjustment is performed using such a mechanism.

Using the pressure device shown in FIG. 13, the mounting of the IC chips was performed as follows. First, the IC chip 3 was mounted on the circuit board 5 after positioning the IC chip 3 in a state that an ACF 10 is not bonded on the board, or only part thereof is bonded. Then, the board was set in the pressure device shown in FIG. 13, and it was pressurized at a desired pressure to fix it at the state. Then, the circuit board 5 after being pressurized was removed therefrom so as to peel off the IC chip 3 for observing the indentation of the bumps. The axes $\alpha$ and $\beta$ were adjusted so that the bumps were uniformly crushed.

Consequently, on the bump-bonding portions on the circuit board 5, the ACF 10 was again bonded after the adjustment was performed to a state that all of the bumps of the IC chip 3 were uniformly pressurized. After positioning and mounting the IC chip 3, it is set in the pressure device shown in FIG. 13 so as to pressurize it at a desired pressure and is fixed at the state. For heat setting the ACF 10 disposed between the circuit board 5 and the IC chip 3, the pressurized pressure device was put into a clean oven for heat setting. Once the pressure device was in the oven, the oven was heated from a room temperature to 170° C. When the temperature of the circuit board, IC chip, and pressure device reached 170° C., the power supply was turned off to cool them naturally. At the room temperature, the pressure device was removed and the pressure was released.

A confirmation of the connection resistance values of the IC chips 3 mounted by the above-described process showed that the entire connection check portions of nine IC chips had an excellent resistance value of 60 m$\Omega$.

Second Embodiment

Figure 14:
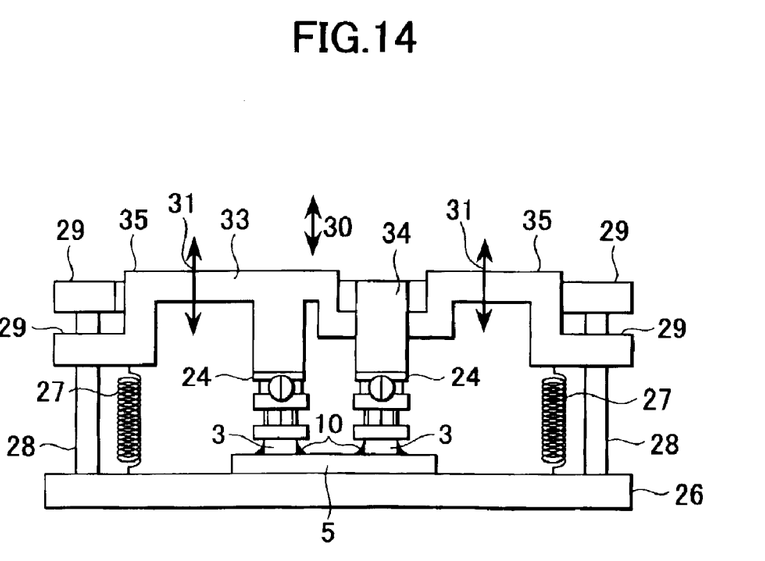
FIG. 14 is a schematic side view of a structure combined by adjacent pressure rectangles having parallelism adjusting mechanisms assembled therein according to a second embodiment of the present invention.
Figure 15:
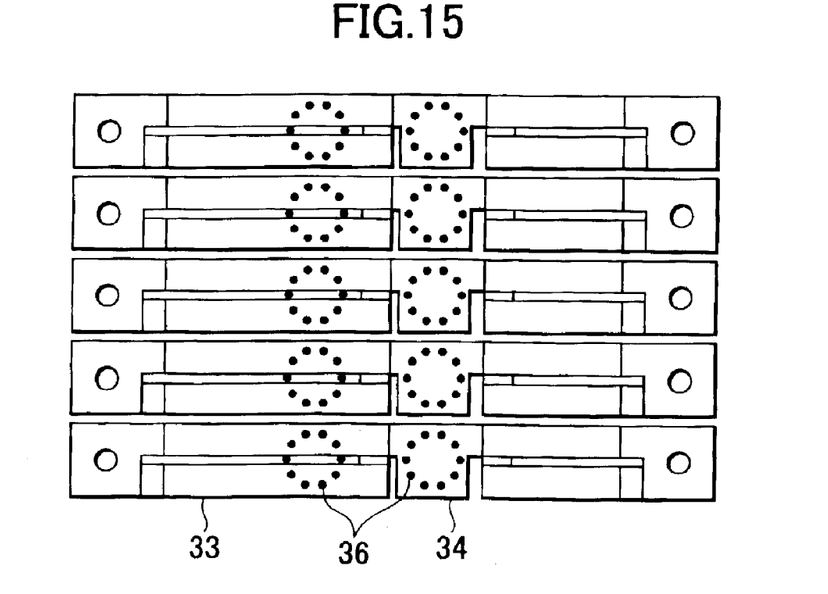
FIG. 15 is a schematic plan view of the structures shown in FIG. 14 and arranged in five lines.
Figure 16:
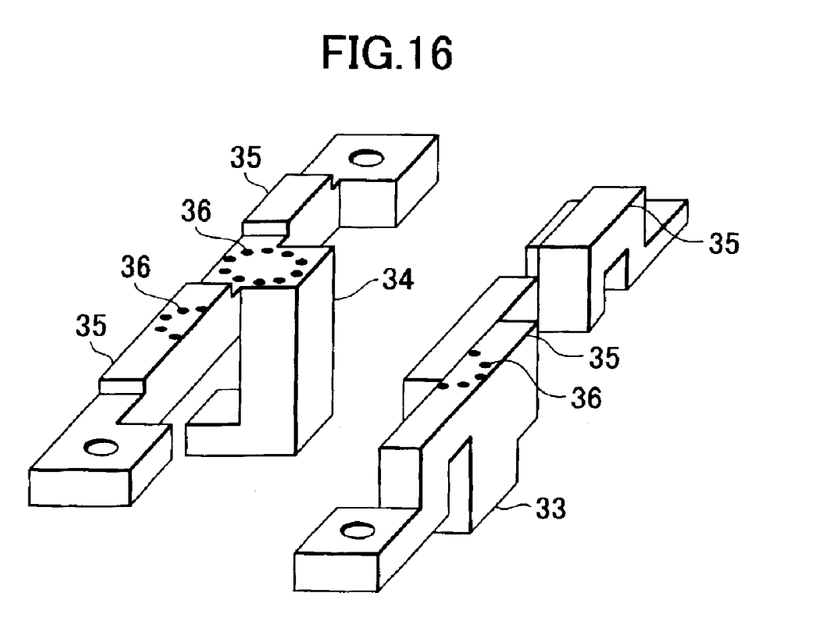
FIG. 16 is a schematic perspective view showing only the pressure rectangle of the structure shown in FIG. 14.

According to a second embodiment, adjacent IC chips to be connected are arranged in two rows. FIG. 14 is a schematic side view of a structure in that neighboring pressure rectangles, each having the parallelism adjusting mechanism 24 assembled therein, are combined. FIG. 15 is a schematic plan view showing a state that the combined structures shown in FIG. 14 are arranged in five lines. FIG. 16 is a schematic perspective view of the combined structure of FIG. 14 showing only the pressure rectangles. In FIGS. 14 to 16, like reference characters designate like members common to FIG. 13, and the detailed description thereof is omitted.

According to the embodiment, pressure rectangles 33 and 34 have the respective parallelism adjusting mechanisms 24, and have a structure entangled with each other so as to be adjacently arranged. A planar portion 35 is for receiving pressure, and the same load can be applied on the same area in the respective pair of pressure rectangles. The basic structure of the pressure device is the same as that described in the first embodiment.

Referring to FIGS. 15 and 16, through-holes 36 of the screws for adjusting parallelism and for fixture are formed in the respective pressure rectangles from the top. This structure enables each one IC chip to move independently so that differences in height can be absorbed to apply a uniform pressure.

A mounting example will be described below using an aggregated pressure device having the parallelism adjusting mechanisms 24, in which lines are arranged in two rows, each line having eight parallelism adjusting mechanisms 24 arranged at an interval of 0.77 mm.

First, the indentation of the bumps was confirmed without the low-pressure and low-temperature ACF so as to adjust the parallelism by moving the screws back and forth. Then, eight IC chips, each having a size of 2.64 mm×10.11 mm×0.175 mm, were arranged in one line at an interval of 0.77 mm, and two lines are simultaneously heated and pressure bonded. As a result, excellent connection resistance values were obtained, enabling collective bonding of 16 chips to be performed.

According to the embodiment, a silicon substrate with a thickness of 625 μm was used as the circuit board 5. The thin IC chip 3 had a thickness of 175 μm, a length of 10.11 mm, and a width of 2.5 mm, and the number of bumps is 446. Nine of the IC chips were used. The gap between adjacent IC chips was 0.77 mm.

The pressure rectangles 33 and 34 are provided with oilless bearings 29 built therein, thereby being vertically moved by following the vertical guides 28. When the IC chips are not pressurized, the pressure rectangle is supported by the support springs 27 so as not to come into contact with the IC chips 3. On the other hand, during the pressurization, the pressure rectangles 33 and 34 are downwardly pressurized with, for example, compressed air.

For heat setting the ACF 10 disposed between the circuit board 5 and the IC chip 3, which were heated and bonded, the pressure device in the pressurized state was heated in a clean oven. After putting the pressure device put into the clean oven, the clean oven was heated from a room temperature to 170° C. When the temperature of the circuit board, IC chip, and pressure device reached 170° C., the power supply was turned off to cool them naturally. At the room temperature, the pressure device was removed and the pressure was released.

A confirmation of the connection resistance values of the IC chips 3 mounted by the process described above showed that the entire connection check portions of nine IC chips have an excellent resistance value of 60 mΩ. The amount of warp of the circuit board 5 in the longitudinal direction was reduced to be 10 μm or less, resulting in a marked improvement in comparison with 50 μm achieved by a conventional process.

According to the present invention, in addition to the embodiments described above, various modifications may be made. For example, according to the above embodiments, the axes α and β are adjustable. Alternatively, one of the axes may be made adjustable. More specifically, referring to FIG. 10, if the longitudinal direction of the V-shaped groove of the pressure receiving member 13 is aligned in parallel with the axis β and the pressure receiving member 13 is directly overlapped on the columnar member 14b while the intermediate member 12 and the columnar member 14a are removed, a pressure device adjustable using only the axis β may be constructed.

According to the embodiment described above, the ACF is used; alternatively, the ACP, NCF, and NCP may be used. Moreover, according to the embodiment, the oven is used for heat setting the ACF; alternatively, it may be performed by heaters built in the pressurizing unit and stage.

Such modifications may incorporate the present invention within the scope of attached claims.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A pressure device for pressure bonding an IC chip on a circuit board of the pressure device comprising:

an IC pressurizing member having an IC pressurizing member groove extending in a predetermined direction, the IC pressurizing member groove being formed on a surface of the IC pressurizing member opposite to a surface of the IC pressurizing member abutting the IC chip;

a columnar member overlapped on the IC pressurizing member so as to bring an external surface of the columnar member into contact within the IC pressurizing member groove;

a pressure receiving member having a pressure receiving member groove extending in a predetermined direction and overlapped on the columnar member so as to bring the external surface of the columnar member into contact within the pressure receiving member groove;

an adjusting member for adjusting parallelism between the IC pressurizing member and the pressure receiving member; and a fixing member for fixing a relative position between the IC pressurizing member and the pressure receiving member.

2. A pressure device for pressure bonding an IC chip on a circuit board of the pressure device comprising:

an IC pressurizing member having an IC pressurizing member groove extending in a first direction, the IC pressurizing member groove being formed on a surface of the IC pressurizing member opposite to a surface of the IC pressurizing member abutting the IC chip;

a first columnar member overlapped on the IC pressurizing member so as to bring an external surface of the first columnar member into contact within the IC pressurizing member groove;

an intermediate member having first and second surfaces opposing each other, the first surface having a first intermediate member groove formed thereon and extending in the first direction, the second surface having a second intermediate member groove formed thereon and extending in a second direction perpendicular to the first direction, the intermediate member being overlapped on the first columnar member so as to bring an external surface of the first columnar member into contact within the intermediate member first groove;

a first adjusting member for adjusting parallelism between the IC pressurizing member and the intermediate member;

a first fixing member for fixing a relative position between the IC pressurizing member and the intermediate member;

a second columnar member overlapped on the intermediate member so as to bring an external surface of the second columnar member into contact within the intermediate member second groove;

a pressure receiving member having a pressure receiving member groove extending in the second direction and overlapped on the second columnar member so as to bring the external surface of the second columnar member into contact within the pressure receiving member groove;

a second adjusting member for adjusting parallelism between the intermediate member and the pressure receiving member; and a second fixing member for fixing a relative position between the intermediate member and the pressure receiving member.

3. A pressure device for pressure bonding an IC chip on a circuit board and having a plurality of pressure mechanisms arranged close to each other, each of the pressure mechanisms comprising:

an IC pressurizing member having an IC pressurizing member groove extending in a first direction, the IC pressurizing member groove being formed on a surface of the IC pressurizing member opposite to a surface of the IC pressurizing member abutting the IC chip;

a first columnar member overlapped on the IC pressurizing member so as to bring an external surface of the first columnar member into contact within the IC pressurizing member groove;

an intermediate member having first and second surfaces opposing each other, the first surface having a first intermediate member groove formed thereon and extending in the first direction, the second surface having a second intermediate member groove formed thereon and extending in a second direction perpendicular to the first direction, the intermediate member being overlapped on the first columnar member so as to bring an external surface of the first columnar member into contact within the first intermediate member groove;

a first adjusting member for adjusting parallelism between the IC pressurizing member and the intermediate member;

a first fixing member for fixing a relative position between the IC pressurizing member and the intermediate member;

a second columnar member overlapped on the intermediate member so as to bring an external surface of the second columnar member into contact within the second intermediate member groove;

a pressure receiving member having a pressure receiving member groove extending in the second direction and overlapped on the second columnar member so as to bring the external surface of the second columnar member into contact within the pressure receiving member groove;

a second adjusting member for adjusting parallelism between the intermediate member and the pressure receiving member; and a second fixing member for fixing a relative position between the intermediate member and the pressure receiving member.

* * * * *